(12) United States Patent
Albert (10) Patent No.: US 7,609,363 B2
(45) Date of Patent: Oct. 27, 2009

(54) HELICAL OPTICAL PULSE STRETCHER

(75) Inventor: Michael M. Albert, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/944,307

(22) Filed: Nov. 21, 2007

(65) Prior Publication Data

US 2008/0068574 A1  Mar. 20, 2008

Related U.S. Application Data

(62) Division of application No. 10/851,247, filed on May 24, 2004, now Pat. No. 7,321,605.

(51) Int. Cl.
*G03B 27/54* (2006.01)
*G03B 27/42* (2006.01)

(52) U.S. Cl. .......................... 355/67; 355/53

(58) Field of Classification Search .............. 355/67, 355/53; 359/618; 372/30, 25, 700; 250/492.2
See application file for complete search history.

(56) References Cited

U.S. PATENT DOCUMENTS

| 6,389,045 | B1 | 5/2002 | Mann et al. | |
|---|---|---|---|---|
| 7,084,959 | B2* | 8/2006 | Albert | 355/67 |
| 7,321,605 | B2 | 1/2008 | Albert | |
| 2005/0190452 | A1* | 9/2005 | Govorkov et al. | 359/618 |
| 2005/0259701 | A1 | 11/2005 | Albert | |

FOREIGN PATENT DOCUMENTS

| JP | 1-132186 A | 5/1989 |
|---|---|---|
| JP | 1-142524 A | 6/1989 |
| JP | 6-214187 A | 8/1994 |

OTHER PUBLICATIONS

Office Action and Translation of Office Action for Japanese Patent Application No. 2005-151508 mailed Apr. 25, 2008, 6 pgs.

\* cited by examiner

*Primary Examiner*—Peter B Kim
(74) *Attorney, Agent, or Firm*—Sterne, Kessler, Goldstein & Fox P.L.L.C.

(57) ABSTRACT

A lithographic system and method using an illumination system, a single pass pulse stretcher, an optical system, a patterning device and a projection system. The optical system is arranged around the single pass pulse stretcher. A beam enters the single pass stretcher and is reflected in a helical path using the optical system for multiple passes through the single pass pulse stretcher. The single pass pulse stretcher can include two 90° prisms, with a beam splitter located therebetween. The optical system can include first and second prisms. At least one of the first and second prisms can be a roof prism. The first and second prisms can have at least one surface oriented so as to direct the beam into the helical path. The optical system can have at least one mirror, or a plurality of mirrors.

14 Claims, 10 Drawing Sheets

HELICAL OPTICAL PULSE STRETCHER

CROSS-REFERENCE TO RELATED APPLICATIONS

This application is a divisional of U.S. patent application Ser. No. 10/851,247, now allowed, filed on May 24, 2004, the disclosure of which is incorporated herein by reference in its entirety.

BACKGROUND OF THE INVENTION

1. Field of the Invention

The present invention relates to pulse stretchers, and more particularly, to helical pulse stretchers for use in lithography applications.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semi-conductive, or insulative layers. This process is then repeated, together with other steps, until the desired features have been formed on the surface, or in various layers, of the wafer.

A difficulty in designing optical components used in microlithography is caused by the high power density involved during exposure. High-powered lasers are often used as a source of illumination in microlithographic systems. These lasers are usually pulsed lasers, which generate relatively short high intensity pulses. The high intensity pulses, over time, damage optical components, such as lenses used in the projection optics, requiring frequent replacement of these optical components. To reduce the effect of the high power density, pulse stretchers are often used in lithographic equipment. A pulse stretcher is a passive optical component that uses an arrangement of beam splitters to extend the duration of the pulse. Pulse stretchers can sometimes be cascaded, to multiply the effect of a single pulse stretcher. However, the volume of space available for the projection optical system with the lithographic tool is limited. Consequently, the volume of space available for the pulse stretcher is also limited, often precluding the use of a large number of cascaded pulse stretchers.

Thus, the purpose of the pulse stretcher is to maintain the energy of the pulse generally constant, while reducing peak intensities by spreading out the pulse in time.

Accordingly, what is needed is a pulse stretcher that is compact and permits a significant stretching of the pulse from a lithographic illumination source.

SUMMARY OF THE INVENTION

The present invention is directed to a helical optical pulse stretcher that substantially obviates one or more of the problems and disadvantages of the related art.

The present invention, in one embodiment, includes a pulse stretcher including a single pass pulse stretcher. An optical system is arranged around the single pass pulse stretcher. A beam enters the single pass stretcher and is reflected in a helical path using the optical system for multiple passes through the single pass pulse stretcher. The single pass pulse stretcher can include two 90° prisms, with a beam splitter located therebetween. The optical system can include first and second prisms. At least one of the first and second prisms can be a roof prism. The first and second prisms can have at least one surface oriented so as to direct the beam into the helical path. The optical system can have one or more mirrors.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and together with the description serve to explain the principles of the invention. In the drawings.

DETAILED DESCRIPTION OF EMBODIMENTS OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1A:
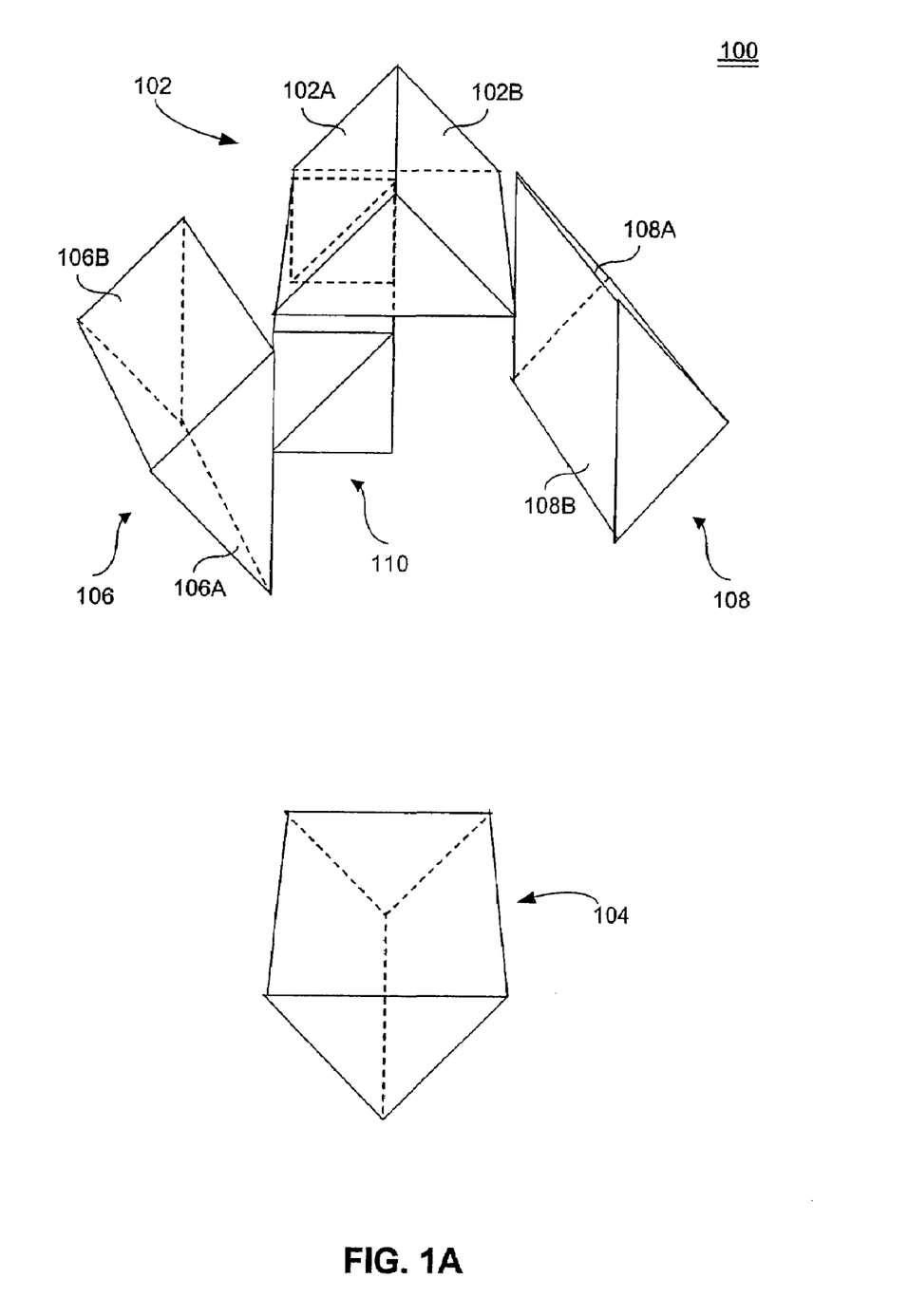
FIGS. 1A and 1B show an exemplary embodiment of the present invention.
Figure 1B:
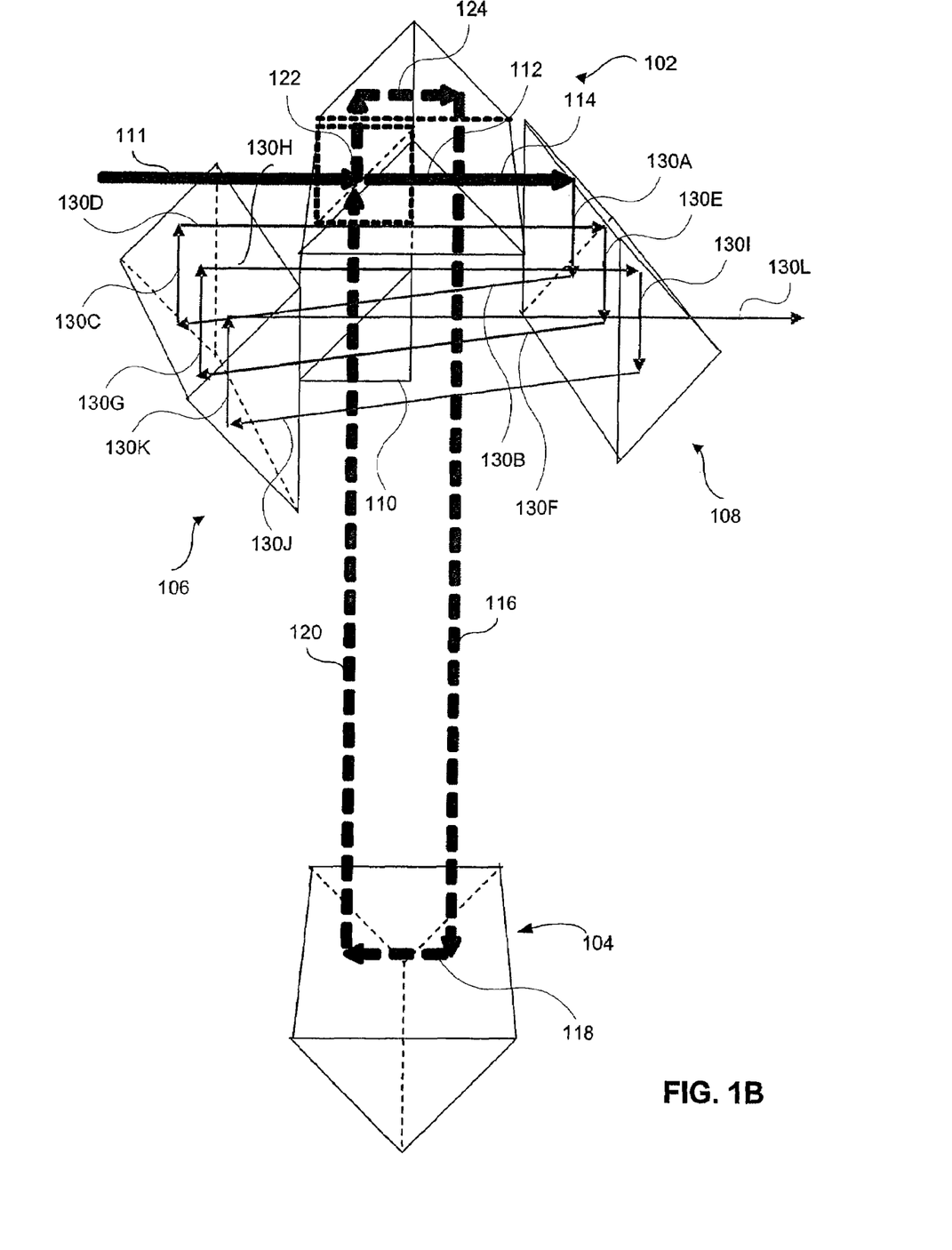

FIGS. 1A and 1B show an exemplary embodiment of the present invention. For clarity, FIG. 1A shows only the optical components, while FIG. 1B shows the same components with the propagating light beams added and labeled. In the discussion below, the sense of direction (i.e., left, right, up, down) is for illustrative use only, and is not intended to limit the present invention.

FIG. 1A illustrates a perspective view of an exemplary pulse stretcher of the present invention. Shown in FIG. 1A are the following components: a prism 102, a beam splitter 110, a prism 104, and two prisms 106 and 108. Prisms 102 and 104 are usually 90° prisms, in other words, as shown by the heavy lines in FIG. 1B, an input beam 111 enters from the left and exits from the right at beam 130L. The input beam 111 travels close to (but does not enter) the prism 106. Ultimately, the output beam 130L is a "stretched" pulse (in the sense of full width half maximum) compared to the pulse of the input beam 111.

As shown in FIG. 1B, the beam 111 enters from the left. Approximately half of the beam 111 continues straight (see 112), while the other half of the beam 111 is reflected by a beam splitter upwards (see beam 122), then is reflected off of surface 102A (beam 124), then is reflected off of surface 102B as beam 116. (Note that surfaces 102A, 102B act as reflective surfaces in this case.) On the return path, the beam 120 encounters the beamsplitter 110. Half of the beam 120 is reflected to the right by the beamsplitter 110 (combining with beam 112), and half continues upwards through the beamsplitter 110 (see beam 122). Thus, considering for the moment only the "thick" beam path in FIG. 1B, this path represents a single-pass beam splitter-pulse stretcher. The expansion of the pulse duration is proportional to the amount of time that it takes for the beam to go "around the loop" (represented by the thick dashed lines). This corresponds to the delay introduced by the system of the prisms 102, 104 and the beam splitter 110.

In practical applications, the amount of delay possible depends on physical system parameters. Greater pulse stretching means longer path lengths for the beams 116 and 120 in FIG. 1B. Such longer path lengths may, to some extent, be achieved using folded optical paths, e.g., using mirrors to fold the optical axis. However, the addition of extra surfaces adds to system complexity, particularly since, to achieve a substantial pulse stretching effect, the effective optical path length of the beams 116 and 120 needs to be fairly long, compared to dimensions of the optical components. This means that the optical path needs to be folded, not just in two dimensions, but often in three dimensions. This introduces additional alignment difficulties.

The prisms 108 and 106 are used to recirculate the beam back through the 102, 104 and 110 components multiple times. As may be further seen in FIGS. 1A and 1B, prism 108 has surfaces 108A and 108B. At least one (and optionally both) surfaces 108A and 108B are oriented such that after reflections of the surfaces, the beam 130 (in this case, 130A, 130E, 130I, see FIG. 1B) is displaced slightly in the direction out of the paper in FIG. 1B. Similarly, the prism 106 has surfaces 106A and 106B, at least one of which is also oriented at a slight angle so as to displace the beam slightly in the direction out of the page. The result of this is a beam that travels along a helical path, in this case is segments 130A-130L, until finally exiting out of the pulse sketcher (beam 130L). Note that since beams used in optical lithographic equipment are often rectangular, the pulse stretcher shown in FIG. 1A is particularly useful in that application. Each pass of the beam as it goes through the components 102, 110, 104 results in 50% of the light being "stretched." Thus, the effect is like having cascaded, or tandem, pulse stretchers.

Figure 4:
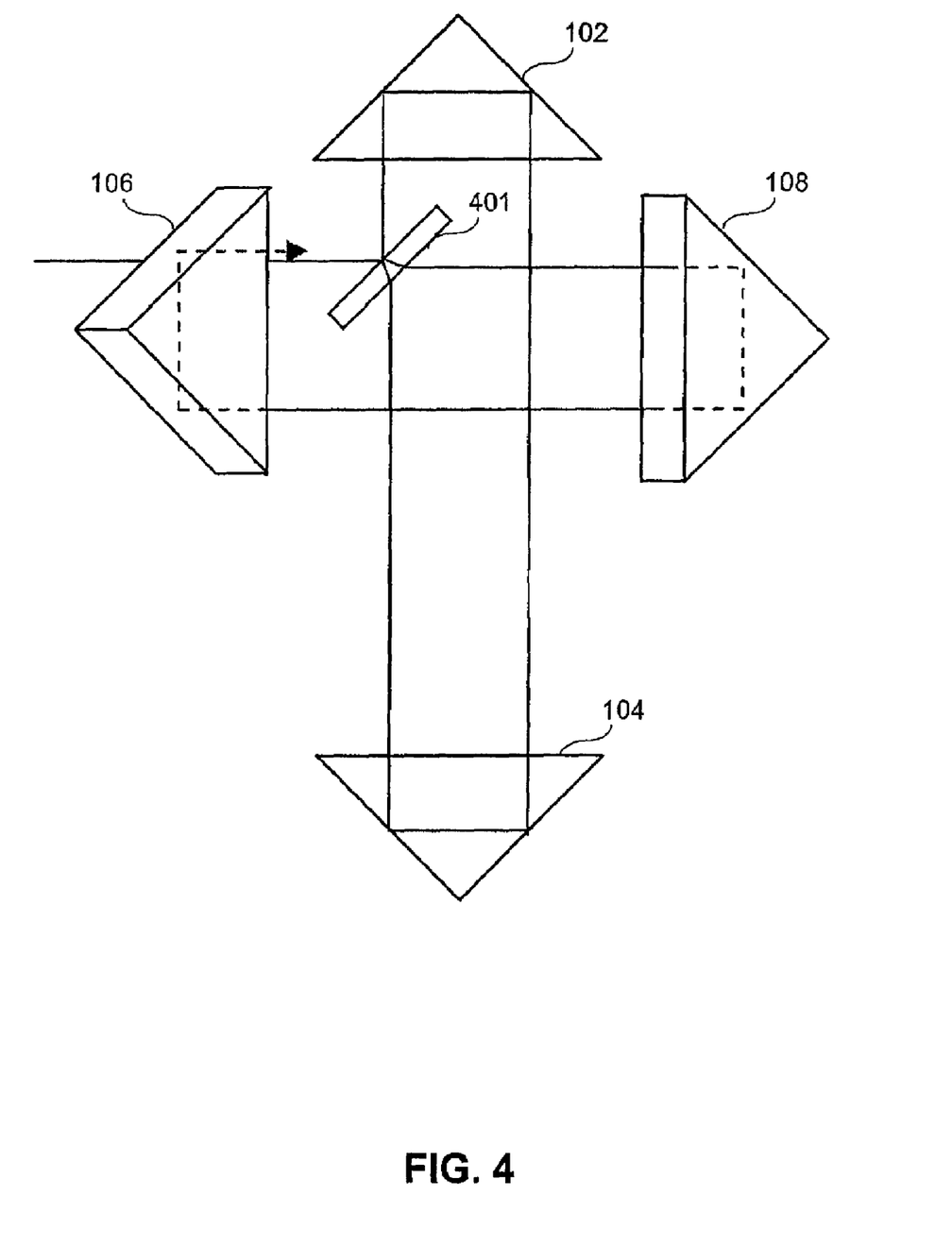
FIG. 4 shows an alternative embodiment using a plate beamsplitter.

Note that instead of prisms 106, 108, which are usually roof-type prisms, mirror surfaces can be used. Alternatively, only some of the surfaces may be used as mirrors, e.g., only prism 108, or only prism 106 can be replaced with mirrors, while the other prism remains as described above. Note also that the beam splitter 110 is shown as a cube, although does not need to be cubical, since any other form of beam splitters may be used (see, e.g., plate beamsplitter 401 shown in an alternative embodiment in FIG. 4).

As a practical matter, a single pulse stretcher with a long delay does not be as efficient as stretching the pulse as using a number of pulse stretchers arranged in a cascade manner. The structure shown in FIG. 1A allows the use of a single pulse stretcher, while achieving the performance of multiple pulse stretchers arranged in a cascade.

Note further that although the prisms 106 and 108 are shown as identical, this need not be the case. The only requirement is that the prisms 106 and 108B be arranged opposite to each other, and at an angle to the path of the incoming beam (i.e. parallel to the beam 111). This enables the helical path of the beam 130A-130L.

In a typical configuration, the number of passes to the prisms 106, 108 would be between 2 and 5, although more passes are possible. The optical designer has to balance the need for more effective pulse stretching against the losses in the optics. Thus, roughly three passes is believed to be optimal.

Figure 5:
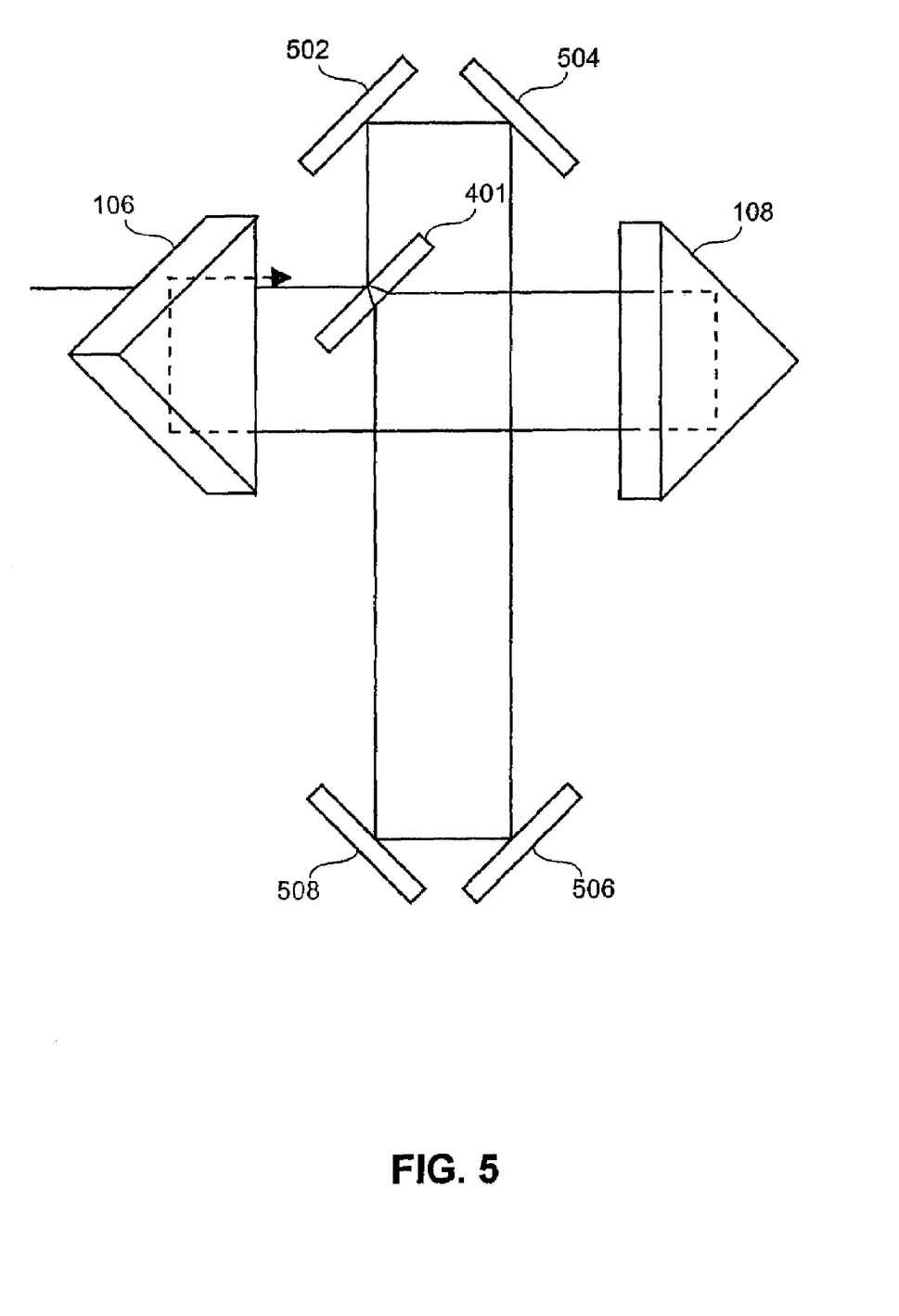
FIGS. 5-9 show alternative embodiments using different mirror combinations.
Figure 6:
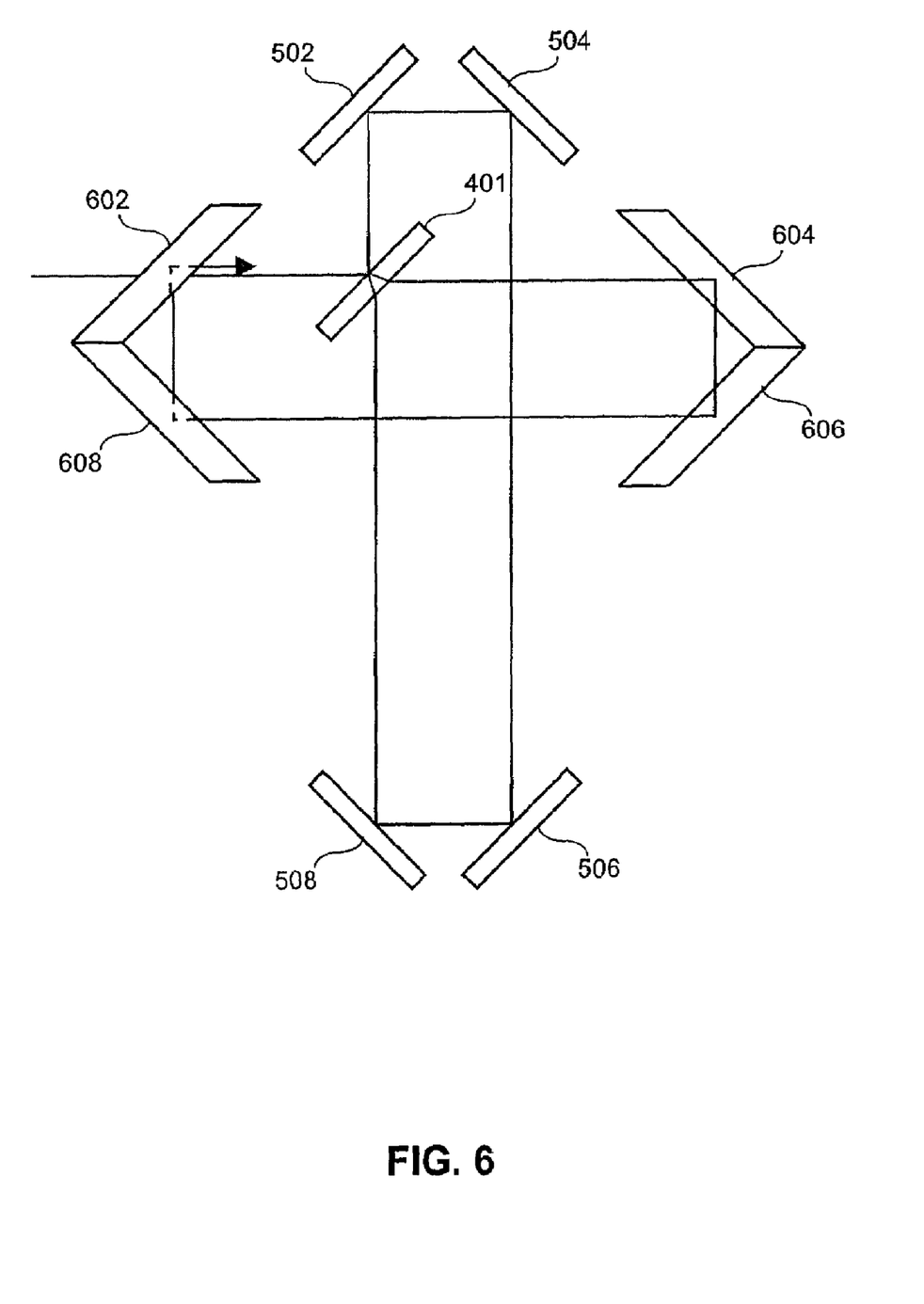

The size of the components shown in FIG. 1A depends on the dimensions of the beam. If the beam were a "pencil" beam of about 1 mm×1 mm, such as shown schematically in FIG. 1A, then the components could be quite small. However, many practical systems have larger rectangular beams, in the order of 25 millimeters by 5 millimeters. In that case, "out of the page" in FIG. 1A would be preferably chosen as the short direction. The prism dimensions would then be on the order of 50 millimeters. Note also that prisms 102, 104 can also be replaced by two mirrored surfaces each (in other words, instead of the prism 104, mirrors can be placed where the surfaces 104A, 104B, or where the surfaces 102A, 102B are located (see, e.g., plate beamsplitter 502, 504, 506, 508 shown in an alternative embodiment in FIG. 5, and mirrors 602, 604, 606, 608 shown in an alternative embodiment in FIG. 6). The prisms maybe made of optical glass, quartz, fused silica, etc., as required by the wavelength of the source. Powered surfaces may be used as prism or mirror surfaces, to counteract beam dispersion. Also, lens(es) may be inserted into the beam path, to counteract beam dispersion.

Figure 2:
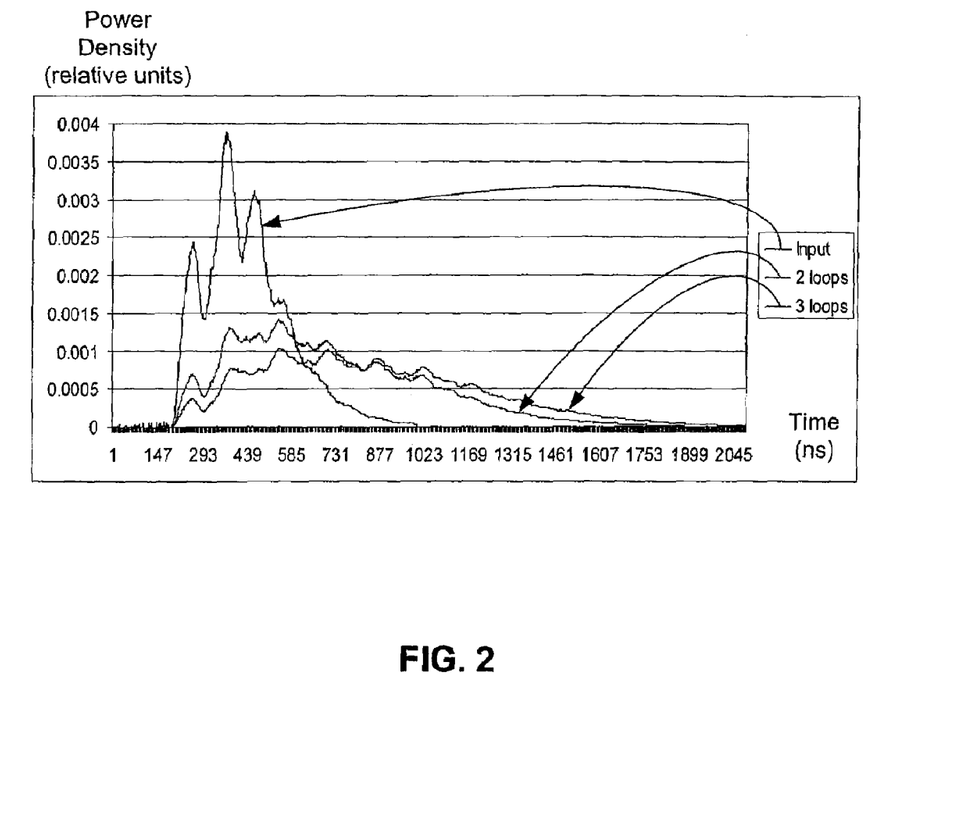
FIG. 2 is a plot illustrating an effect of using the pulse stretcher of the present invention.

FIG. 2 shows an effect of using the pulse stretcher of the present invention on the pulse profile. The horizontal axis is time (in nanoseconds), and the vertical axis is power density of the pulse, in relative units. Note that the pulse, after passing through the pulse stretcher of the present invention, is much smoother and longer, with correspondingly lower power densities.

Figure 7:
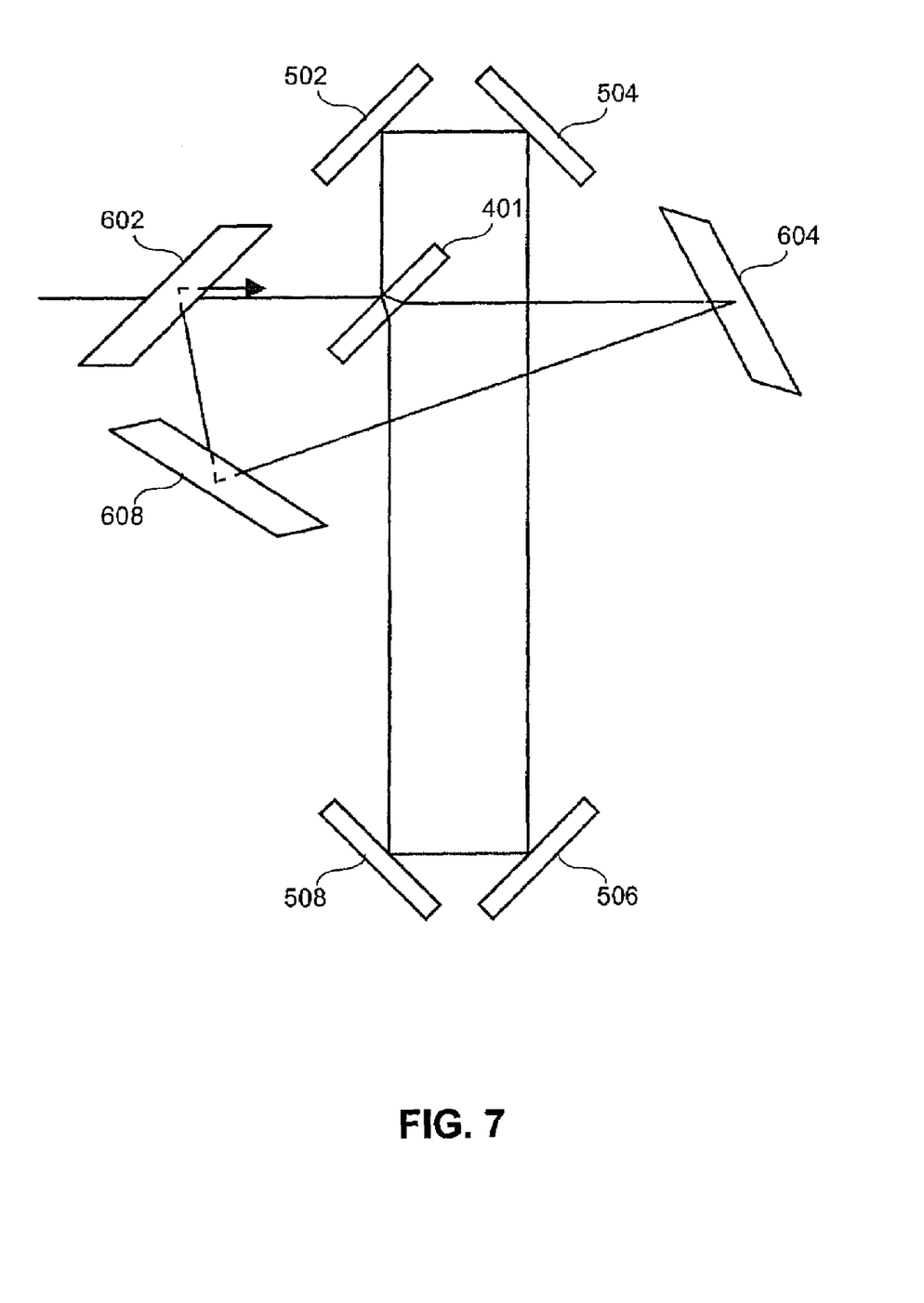
Figure 8:
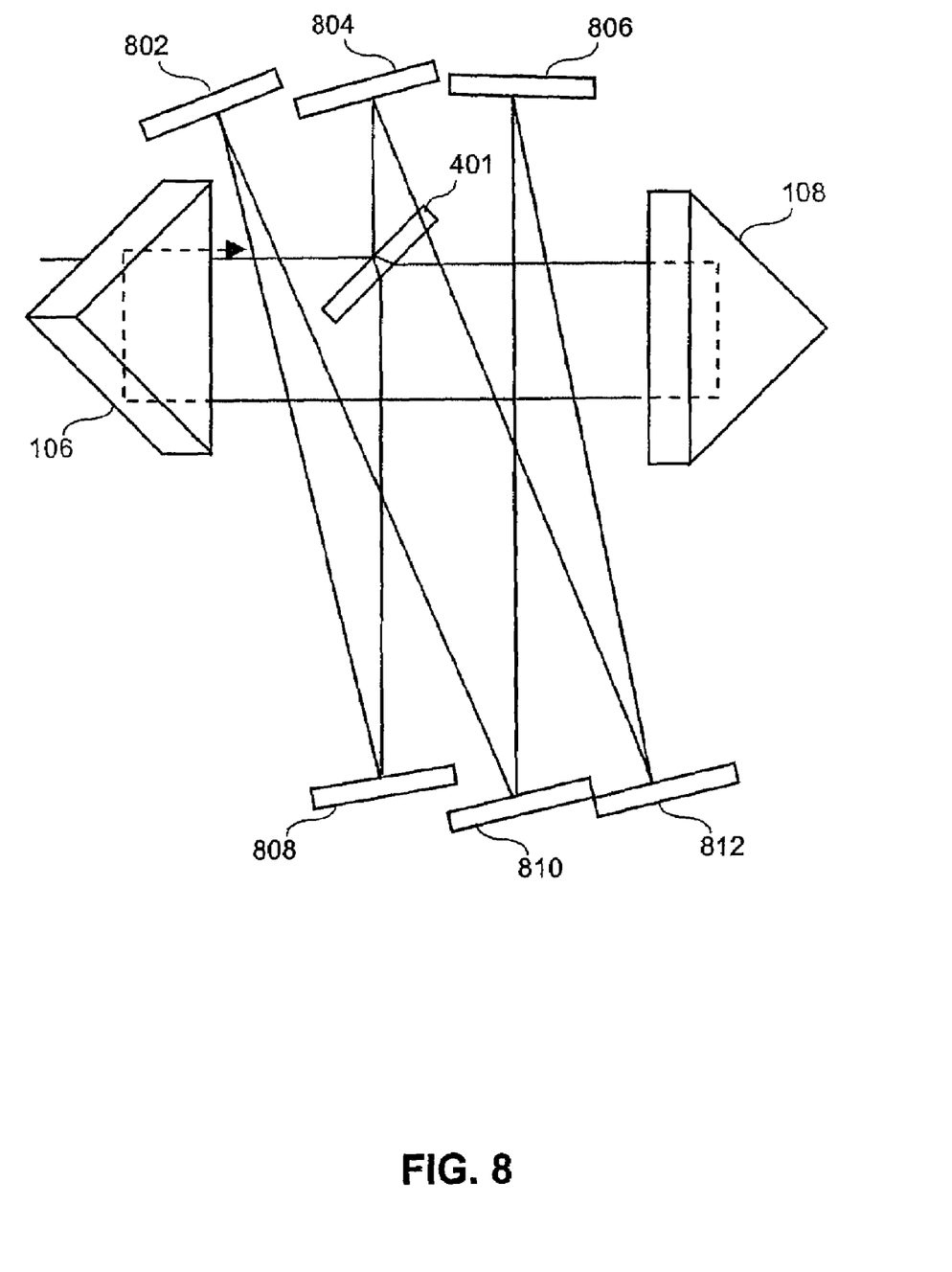

Note further that elements 102, 110, 104 need not be the same as shown in FIG. 1A. Any single-pass pulse stretcher may be placed "in the middle" between the prisms 106, 108 to achieve the same effect (with proper alignment). Note further that it is also possible to replace the prisms 106, 108 with three mirrors instead of four, see mirrors 602, 604, 608 illustrated in an alternative embodiment in FIG. 7 (although the angles would change, compared to what is shown in FIG. 1A). As yet another alternative, it is possible to use multiple mirrors arranged as shown, for example, by mirrors 802, 804, 806, 808, 810 and 812 in FIG. 8.

Figure 9:
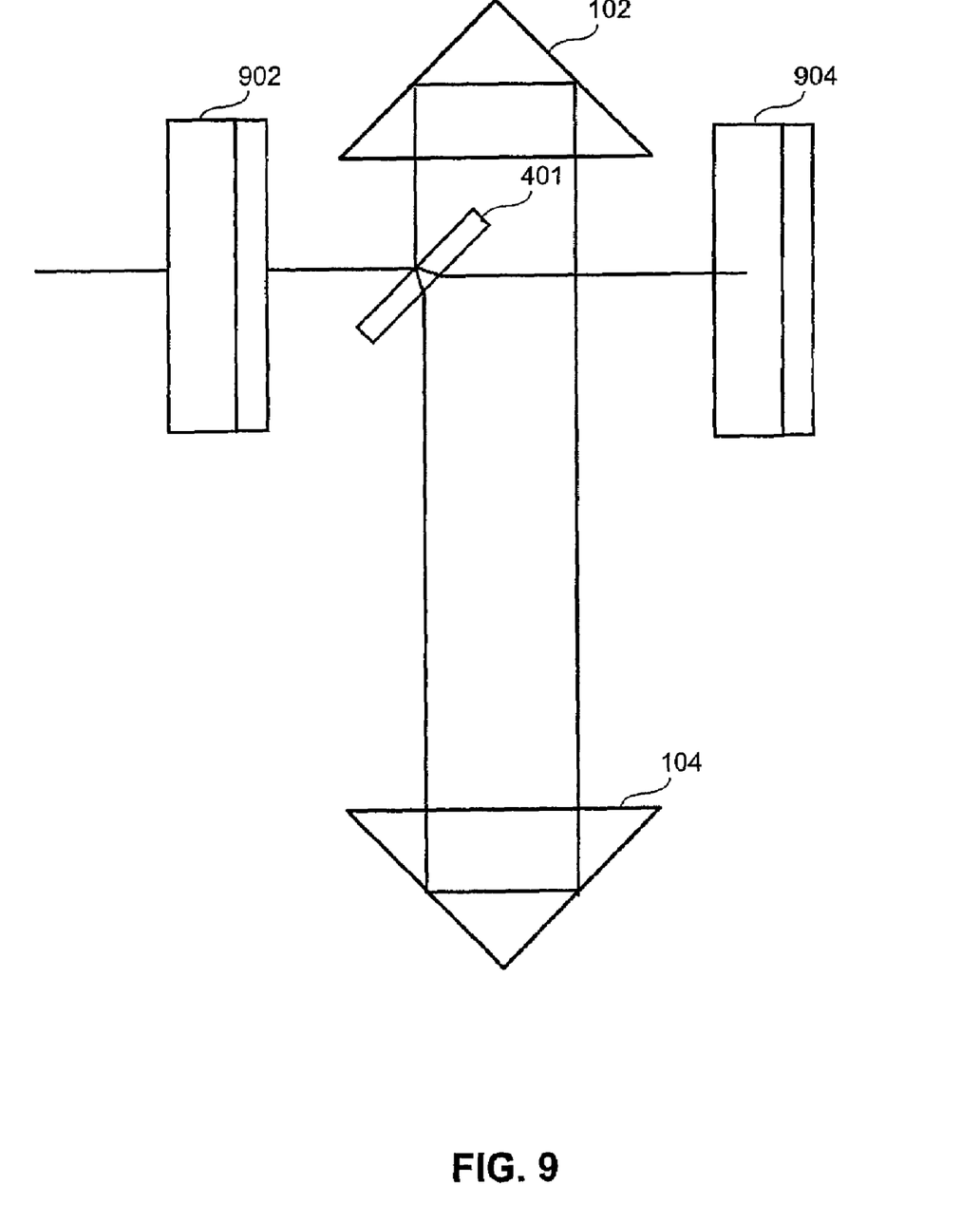

It is also possible to use only one mirror each, to replace prisms 106, 108, as shown by elements 902, 904 in an alternative embodiment of FIG. 9. In that case, it would not be possible to have a helical path as shown by the beam path 130A-130L and the price paid for that is a slight blurring of the beam in at least one dimension. However, it is possible to accomplish the pulse stretching, if the engineering consequences of the above are accepted, with using only two mirrors to replace prisms 106, 108. Note that in a case of replacing only a single of the road prisms 106, 108 with a single mirror, the remaining roof prism would not be a 45° prism but a slightly different angle, in order to achieve the same effect.

There are a number of ways of manufacturing the pulse stretcher shown in FIG. 1A. For example, it is possible to manufacture all the components as separate components, and then align them together. It is possible to bond the beam splitter 110 to the prism 102. It is also possible to manufacture, for example, components 106, 110 and 102 as a single component or components 106, 102 110 and 108 as a single component, or some combination thereof. Because the relative angular alignment between the shown surfaces is important, and because manufacturing single components with the required tolerances and angular orientation can be more difficult than manufacturing them separately, and then aligning them relative to each other, there are engineering tradeoffs between manufacturability and subsequent alignment.

Figure 3:
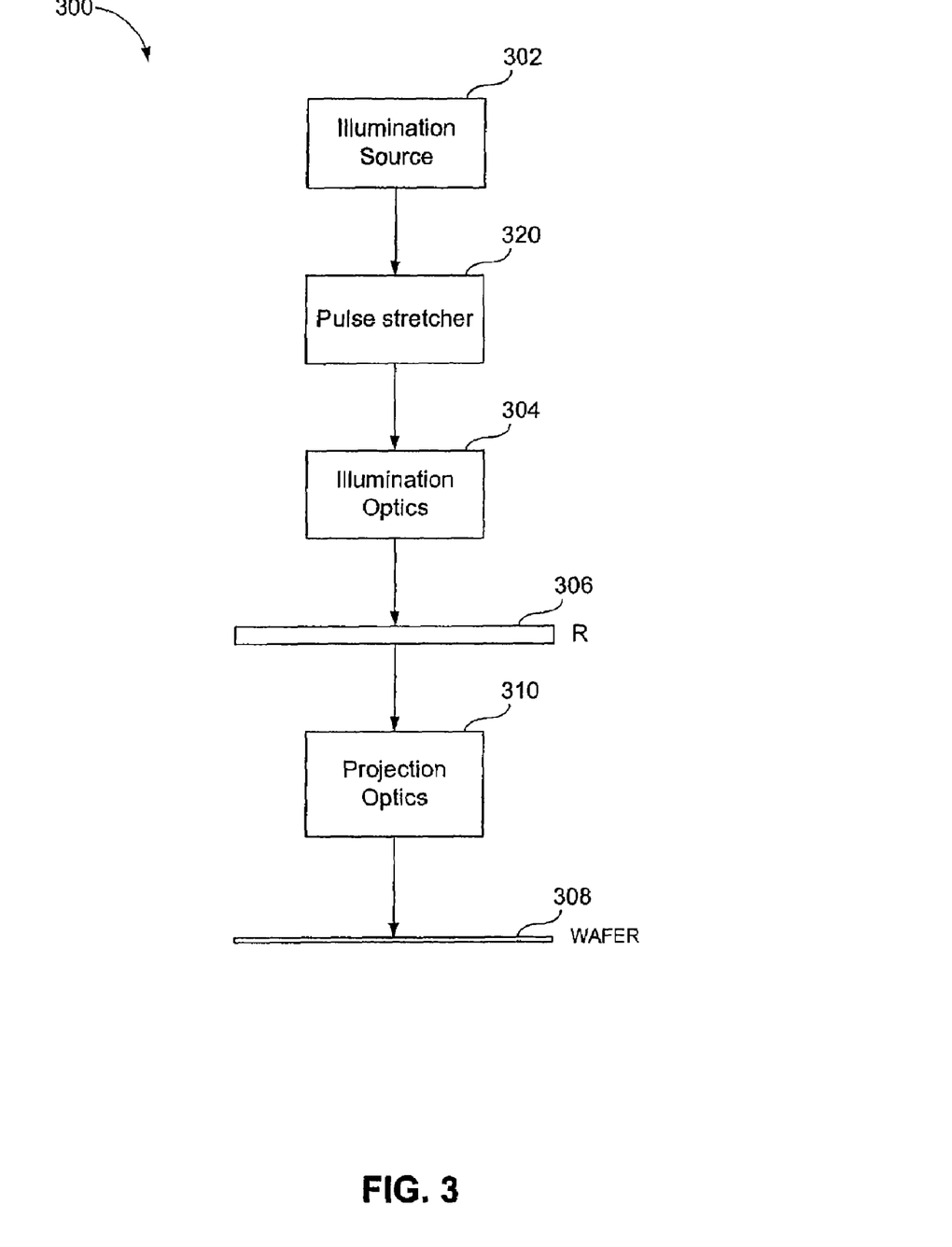
FIG. 3 shows a lithography system according to an embodiment of the present invention.

FIG. 3 shows a system 300 according to an embodiment of the present invention. System 300 includes an illumination source 302 that outputs light to illumination optics 304. Illumination optics 304 direct the light through (or off) a mask or reticle 306 onto a substrate 308 via projection optics 310. The pulse stretcher is shown as element 320 in FIG. 3. One embodiment for this system can be a lithography system, or the like. Another embodiment can be a holography system.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
    an illumination system configured to produce a beam of radiation;
    a single pass pulse stretcher;
    an optical system arranged around the single pass pulse stretcher such that the beam of radiation is directed in a helical path for two or more passes through the single pass pulse stretcher to produce a pulse stretched beam;
    a patterning device configured to pattern the pulse stretched beam; and
    a projection system configured to project the patterned beam onto a target portion of a substrate.

2. The lithographic apparatus of claim 1, wherein the optical system comprises a first prism and a second prism.

3. The lithographic apparatus of claim 1, wherein the single pass pulse stretcher comprises:
    a beam splitter; and
    two 90° prisms,
    wherein the beam splitter is located between the two 90° prisms.

4. The lithographic apparatus of claim 2, wherein first and second prisms are roof prisms.

5. The lithographic apparatus of claim 2, wherein the first and second prisms have at least one surface oriented so as to direct the beam of radiation into the helical path.

6. The lithographic apparatus of claim 1, wherein the optical system comprises a mirror.

7. The lithographic apparatus of claim 1, wherein the optical system comprises a plurality of mirrors.

8. A method, comprising:
    stretching a beam of radiation such that the beam of radiation is directed in a helical path using an optical system arranged around a single pass pulse stretcher for two or more passes through the single pass pulse stretcher to produce a pulse stretched beam;
    patterning the pulse stretched beam; and
    projecting the patterned beam onto a target portion of a substrate.

9. The method of claim 8, wherein the optical system comprises a first prism and a second prism.

10. The method of claim 9, wherein the first and second prisms are roof prisms.

11. The method of claim 9, wherein the first and second prisms have at least one surface oriented so as to direct the beam of radiation into the helical path.

12. The method of claim 8, wherein the single pass pulse stretcher comprises a beam splitter between two 90° prisms.

13. The method of claim 8, wherein the optical system comprises a mirror.

14. The method of claim 8, wherein the optical system comprises a plurality of mirrors.

* * * * *